(12) United States Patent
Bovington et al.

(10) Patent No.: US 10,090,645 B2
(45) Date of Patent: Oct. 2, 2018

(54) INTEGRATED LASER WITH DBR-MRR MIRROR AND MULTIPLE DROP PORTS THAT PROVIDE BALANCED POWER

(71) Applicant: Oracle International Corporation, Redwood Shores, CA (US)

(72) Inventors: Jock T. Bovington, La Jolla, CA (US); Xuezhe Zheng, San Diego, CA (US); Ashok V. Krishnamoorthy, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 287 days.

(21) Appl. No.: 15/190,994

(22) Filed: Jun. 23, 2016

(65) Prior Publication Data

US 2018/0191137 A1   Jul. 5, 2018

(51) Int. Cl.
*H01S 5/50* (2006.01)
*H01S 5/10* (2006.01)
*H01S 5/125* (2006.01)
*G02B 6/122* (2006.01)

(52) U.S. Cl.
CPC .............. *H01S 5/50* (2013.01); *G02B 6/1228* (2013.01); *H01S 5/1014* (2013.01); *H01S 5/125* (2013.01)

(58) Field of Classification Search
CPC .......... H01S 5/50; H01S 5/1014; H01S 5/125; G02B 6/1228
See application file for complete search history.

(56) References Cited

U.S. PATENT DOCUMENTS

2016/0156149 A1*  6/2016  Takabayashi ........... H01S 5/142
                                                            372/6
2017/0353007 A1* 12/2017  Kobayashi ............. H01S 5/068

OTHER PUBLICATIONS

Nemoto et al.; "Narrow spectral linewidth wavelength tunable laser with Si photonicwire waveguide ring resonators," Group IV photonics, ThD4, 126-128 (2012).
Fujioka et al.; "Compact and low power consumption hybrid integrated wavelength tunable laser module using silicon waveguide resonators," J. of Lightwave Technology 28 (21), 3115-3120 (2010).
(Continued)

*Primary Examiner* — Dung Nguyen
(74) *Attorney, Agent, or Firm* — Park, Vaughan, Fleming & Dowler LLP (57) ABSTRACT

An integrated laser that provides multiple outputs includes a reflective silicon optical amplifier (RSOA) having a reflective end with a reflective coating and an interface end. It also includes an optical waveguide optically coupled to the RSOA. A distributed-Bragg-reflector (DBR) ring resonator is also optically coupled to the optical waveguide, wherein the DBR ring resonator partially reflects a wavelength of the optical signal from the optical waveguide, thereby causing balanced light to flow in clockwise and counter-clockwise directions inside the DBR ring resonator. The integrated laser additionally includes an output waveguide having 2*N ends that function as two outputs, wherein the output waveguide is optically coupled to the DBR ring resonator, which causes balanced light to flow in two directions in the output waveguide, thereby causing the 2*N outputs to provide balanced power.

20 Claims, 7 Drawing Sheets

(56) References Cited

OTHER PUBLICATIONS

Akiyama et al.; "1-Vpp 10-Gb/s operation of slow-light silicon Mach-Zehnder modulator in wavelength range of 1 nm," Group IV photonics, WC7, 45-47 (2010).
Akiyama et al.; "Wavelength-tuning-free 10-Gb/s operation of a silicon-integrated resonantly-enhanced modulator and single-mode laser," Group IV photonics, FD3, 358-360 (2012).
Lee et al.; "High power and widely tunable Si hybrid external-cavity laser for power efficient Si photonics WDM links.," Opt. Express, vol. 22, No. 7, pp. 7678-7685, Apr. 2014.
Kang et al.; "A Microring Resonator with an Integrated Bragg Grating: a Compact Replacement for a Sampled Grating Distributed Bragg Reflector", Opt Quant Electron (2009) 41:689-697, DOI 10.1007/s11082-010-9380-4.
Kang et al.; Engineering the Spectral Reflectance of Microring Resonators with Integrated Reflective Elements, received Jun. 23, 2010, revised Jul. 19, 2010, published Jul. 23, 2010, Aug. 2, 2010/vol. 18, No. 16/Optics Express 16813.
Arbabi et al.; "Realization of Small Footprint Microring Reflectors", vol. 3, pp. 5-6, 2011.
Arbabi et al.; "Realization of a Narrowband Single Wavelength Microring Mirror" Published by the American Institute of Physics, 2011.

\* cited by examiner

INTEGRATED LASER WITH DBR-MRR MIRROR AND MULTIPLE DROP PORTS THAT PROVIDE BALANCED POWER

GOVERNMENT LICENSE RIGHTS

This invention was made with U.S. government support under Agreement No. HR0011-08-9-0001 awarded by DARPA. The U.S. government has certain rights in the invention.

BACKGROUND

Field

The disclosed embodiments relate to the design of a laser. More specifically, the disclosed embodiments relate to the design of an integrated laser with a distributed Bragg reflector (DBR) micro-ring resonator (MRR) mirror and multiple drop ports that provide balanced output power.

Related Art

Silicon photonics is a promising technology that can provide large communication bandwidth, low latency and low power consumption for inter-chip and intra-chip connections or optical links. In order to achieve low-latency, high-bandwidth optical connectivity, a variety of optical components is needed, including: optical modulators, optical detectors, wavelength multiplexers/demultiplexers and optical sources such as lasers. One fundamental component that is required for such devices, especially lasers, is an integrated mirror.

One approach for implementing an integrated mirror is a distributed Bragg reflector (DBR). While DBRs can select a single wavelength, they have a wide bandwidth reflection spectrum, which typically makes DBRs a poor choice for long optical cavities because numerous competing optical-cavity modes will arise.

Ring-resonator mirrors are often a better choice than DBRs for providing mode-selectivity because of their sharp resonance peaks. However, ring-resonator mirrors have periodic peaks that can occur multiple times within the spectral bandwidth of an optical gain medium, and thus can introduce competing optical modes in an optical source such as a laser.

Also, while implementing a laser, it is often desirable for the laser to produce multiple outputs that provide optical signals with balanced power. For example, these multiple optical outputs can be used as carrier signals, which are modulated with a communication signal to communicate information. Note that using a single laser that produces multiple balanced outputs is preferable to using multiple lasers to produce multiple outputs because the different gain media associated with the multiple lasers can introduce a significant amount of unreliability.

Hence, what is needed is a technique for implementing an integrated laser that produces multiple balanced outputs without the above-described problems.

SUMMARY

One embodiment of the present disclosure provides an integrated laser with multiple balanced outputs. This integrated laser includes a reflective silicon optical amplifier (RSOA) having a reflective end with a reflective coating and an interface end. It also includes an optical waveguide with a first end and a second end, wherein the first end is optically coupled to the interface end of the RSOA. Moreover, a distributed-Bragg-reflector (DBR) ring resonator is optically coupled to the optical waveguide at a location proximate to the second end of the optical waveguide. This DBR ring resonator partially reflects a wavelength of the optical signal from the optical waveguide, wherein the partial reflections cause balanced light to flow in clockwise and counter-clockwise directions inside the DBR ring resonator. Note that the RSOA, the optical waveguide and the DBR ring resonator collectively form a lasing cavity for the integrated laser. Finally, the integrated laser includes an output waveguide having two ends that function as two outputs for the integrated laser, wherein the output waveguide is optically coupled to the DBR ring resonator, which causes balanced light to flow in two directions in the output waveguide, thereby causing the two to provide balanced power.

In some embodiments, the integrated laser also includes one or more additional output waveguides optically coupled to the DBR ring resonator, wherein each additional output waveguide has two ends that function as outputs for the integrated laser, wherein output power is balanced among all of the outputs of the integrated laser.

In some embodiments, the integrated laser also includes a monitoring port located at the second end of the optical waveguide.

In some embodiments, the DBR ring resonator provides a narrow reflection peak resulting from overlapping of ring-resonance peaks and a DBR reflection peak inside the DBR ring resonator.

In some embodiments, the DBR ring resonator is comprised of a dielectric material and the output waveguide is comprised of silicon.

In some embodiments, the DBR ring resonator includes DBR grating-waveguide perturbations that fill one of: 50% of the circumference of the DBR ring resonator, and 100% of the circumference of the DBR ring resonator.

In some embodiments, an associated modulator is coupled to each output of the integrated laser, wherein each output provides an optical carrier signal that is modulated by the associated modulator to communicate information.

In some embodiments, the optical waveguide and the DBR ring resonator are located on a separate semiconductor chip from the RSOA. This separate semiconductor chip can include: a substrate; a buried-oxide layer disposed on the substrate; and a semiconductor layer disposed on the buried-oxide layer, wherein the optical waveguide and the DBR ring resonator are defined in the semiconductor layer.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview

The disclosed embodiments provide an integrated laser with multiple balanced outputs. This integrated laser includes a DBR ring resonator that functions as a mirror with a reflection peak selected by the overlap of ring-resonance peaks and a DBR reflection peak inside the DBR ring resonator. This reflection peak is narrow because circulation of light inside the ring effectively provides a longer DBR while maintaining the compact size of the ring for efficiency tuning. This integrated laser also includes multiple drop ports and a monitor port that are integrated into a single device, which can be designed to reduce the power sent to the monitor port and balance the power emanating from the drop ports so that a high-efficiency laser operation can be achieved for a parallel set of outputs.

Integrated Laser

Figure 1A:
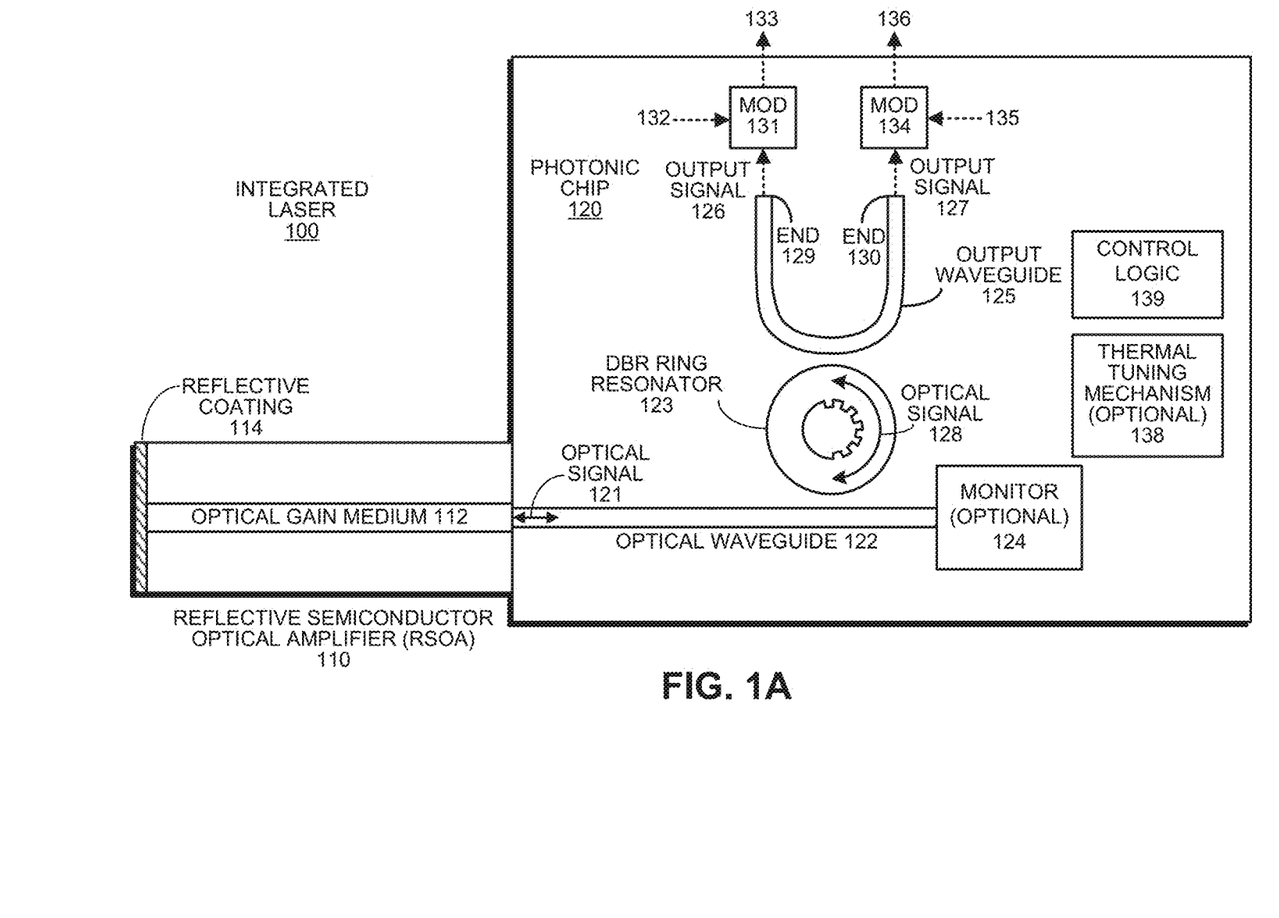
FIG. 1A illustrates an integrated laser in accordance with the disclosed embodiments.

FIG. 1A illustrates an integrated laser 100 in accordance with the disclosed embodiments. This integrated laser 100 includes a reflective semiconductor optical amplifier (RSOA) 110 that includes an optical gain medium 112, and also has a reflective coating 114 at one end. Note that this optical gain medium 112 may include a III-V semiconductor, such as gallium-arsenide, indium-phosphide, erbium or germanium. In some embodiments, a high reflectivity mirror is integrated into the optical gain medium 112 instead of using the reflective coating 114. For example, this integrated high reflectivity mirror can include: a strong DBR, a notched mirror, or a metal layer.

During operation, RSOA 110 generates an optical signal 121, which has an associated carrier or fundamental wavelength λ (such as 1.3 or 1.55 μm). Optical signal 121 feeds into an optical waveguide 122 located in a separate photonic chip 120. This optical waveguide 122 is itself optically coupled to a DBR ring resonator 123, which is also incorporated in photonic chip 120. During operation, DBR ring resonator 123 reflects optical signal 121 so that RSOA 110, optical waveguide 122 and the DBR ring resonator 123 collectively form a lasing cavity for the integrated laser. Optical waveguide 122 can also be coupled to an optional monitor 124, which can be used to determine the alignment between laser cavity modes with a mirror resonance for DBR ring resonator 123.

DBR ring resonator 123 includes internal grating-waveguide perturbations that cause partial reflections in an optical signal 128, which is circulating inside DBR ring resonator 123. These grating-waveguide perturbations can fill: 50% of a total circumference of the ring, or 100% of a total circumference of the ring. Note that a 50% fill factor can maximize multiple resonances associated with free spectral range (FSR) resonance modes of the ring resonator. On the other hand, a 100% fill factor can ensure that the effective index of refraction of the ring resonator and the DBR are identical. Note that ideal ratios for a single wavelength reflector design are complete or half-filled ring resonators with an optical circumference equal to $n_{eff} 2\pi R$. Also note that the partial reflections within DBR ring resonator 123 resulting from the grating perturbations cause optical signal 128 to have balanced light flowing in both clockwise and counter-clockwise directions.

As illustrated in FIG. 1A, integrated laser 100 also includes an output waveguide 125, which is optically coupled to the DBR ring resonator 123. This output waveguide 125 has two ends 129 and 130 that provide outputs for integrated laser 100. Because optical signal 128 within DBR ring resonator 123 has balanced light flow in both clockwise and counter-clockwise directions, the optical coupling with output waveguide 125 causes the light flow in output waveguide 125 to be balanced in two directions. As a result, the output signals 126 and 127 from output waveguide 125 provide balanced power.

In some embodiments, optical output signals 126 and 127 comprise optical carrier signals that feed into modulators 131 and 134, respectively. This enables modulators 131 and 134 to modulate these optical output signals 126 and 127 to communicate information. More specifically, modulator 131 modulates output signal 126 with an information signal 132 to generate a modulated signal 133, which is communicated off-chip. Similarly, modulator 134 modulates output signal 127 with an information signal 135 to generate a modulated signal 136, which is also communicated off-chip.

Additionally, integrated laser 100 may include an optional thermal-tuning mechanism 138 (such as a silicon-based resistive heater or a resistive metal heater), which is thermally coupled to DBR ring resonator 123. Integrated laser 100 also includes control logic 139 (that can be a circuit implemented in silicon), which is electrically coupled to monitor 124 and optional thermal-tuning mechanism 138. During operation, control logic 139 thermally tunes one or more tunable wavelengths of DBR ring resonator 123 based on the measurement of at least the one of the tunable wavelengths. For example, control logic 139 may implement a wavelength-based feedback loop that uses measurements of a tunable wavelength obtained from monitor 124. Alternatively, integrated laser 100 may include an interface (not shown) that receives wavelength-feedback information from an optional external wavelength sensor (not shown).

Figure 1B:
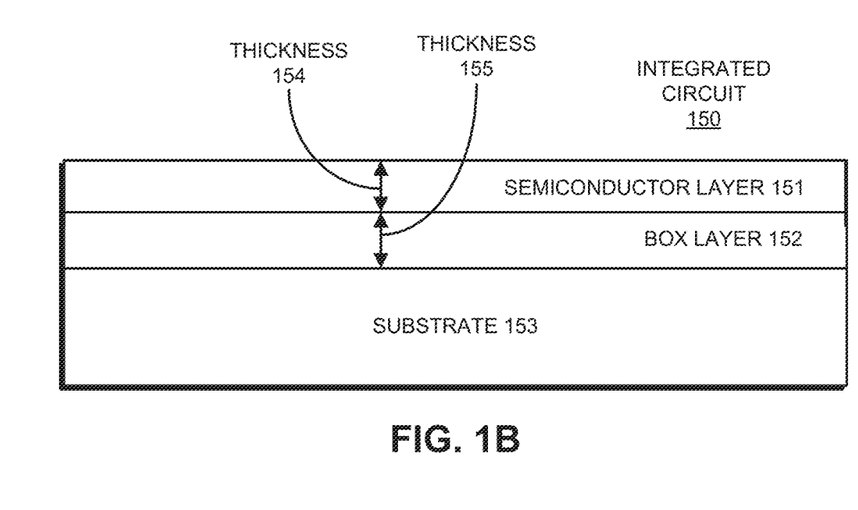
FIG. 1B illustrates the structure of an integrated circuit that is part of the integrated laser in accordance with the disclosed embodiments.

Photonic chip 120 may be implemented on an integrated circuit using a silicon-on-insulator (SOI) technology. For example, an exemplary integrated circuit for photonic chip 120 is illustrated in FIG. 1B, which presents a side view of an integrated circuit 150. Some of the components of integrated laser 100 are implemented in a semiconductor layer 151 in integrated circuit 150, wherein semiconductor layer 151 can be silicon. Furthermore, semiconductor layer 151 may be disposed on or bonded to a buried-oxide (BOX) layer 152 (such as silicon-dioxide), which, in turn, is disposed on a substrate 153 (such as silicon). Note that BOX layer 152 may have a low optical index of refraction to provide cladding. Moreover, semiconductor layer 151 may have a high optical index of refraction to function as an optical waveguide. Note that these materials are merely provided as examples; other materials may be used.

In some embodiments, optical signals 121 and 128 in FIG. 1A have wavelengths between 1.1-1.7 μm. For example, optical signals 121 and 128 can have a fundamental wavelength of 1.3 or 1.55 μm. Moreover, the optical waveguide 122 in semiconductor layer 151 may have a thickness 154 between 0.25 and 3 μm, and a width between 0.5 and 3 μm. Note that because the optical waveguide may have a quasi-rectangular cross-section, it may be a quasi-single mode component. Moreover, BOX layer 152 may have a thickness 155 between 0.3 and 3 μm.

Referring to FIG. 1A, the optical coupling between RSOA 110 and photonic chip 120 may include: edge coupling (such as facet-to-facet optical coupling); vertical or surface-normal coupling (such as a vertical-angled technique using an angled-facet output on the RSOA 110, and grating couplers on photonic chip 120), and/or optical proximity communication, which may involve using reflective mirrors and/or evanescent coupling. In an exemplary embodiment, edge-to-edge coupling is facilitated by using a wide optical waveguide within RSOA 110 (such as an optical waveguide having a width of 2-3 μm), and optical waveguide 122 may have a width of several hundred nanometers.

Figure 2:
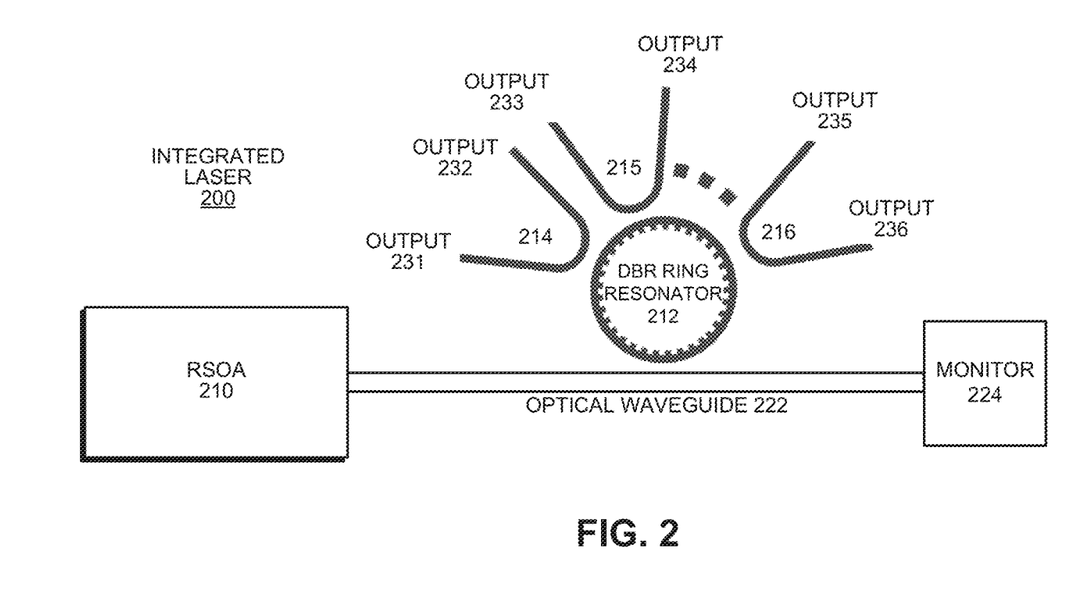
FIG. 2 illustrates an integrated laser with a large number of outputs in accordance with the disclosed embodiments.

If DBR ring resonator 123 is sufficiently large, it is possible to couple multiple output waveguides to DBR ring resonator 123 to provide more than two balanced outputs. For example, FIG. 2 illustrates an integrated laser 200 with a larger number of outputs in accordance with the disclosed embodiments. This integrated laser 200 also includes an RSOA 210, an optical waveguide 222, a DBR ring resonator 212 and a monitor 224. However, DBR ring resonator 212 is large enough to accommodate multiple output waveguides 214, 215 and 216, each of which provides two balanced outputs. More specifically, output waveguide 214 provides outputs 231 and 232, output waveguide 215 provides outputs 233 and 234, and output waveguide 216 provides outputs 235 and 236. If sufficient care is taken in designing these output waveguides, the output power will be the same across all of the outputs of all of waveguides. Hence, a system that has N such optical waveguides can provide 2N balanced outputs. Note that there exists a minimum bend radius for these output waveguides that constrains the number of output waveguides that can be incorporated into the system before bending losses arise.

Figure 3:
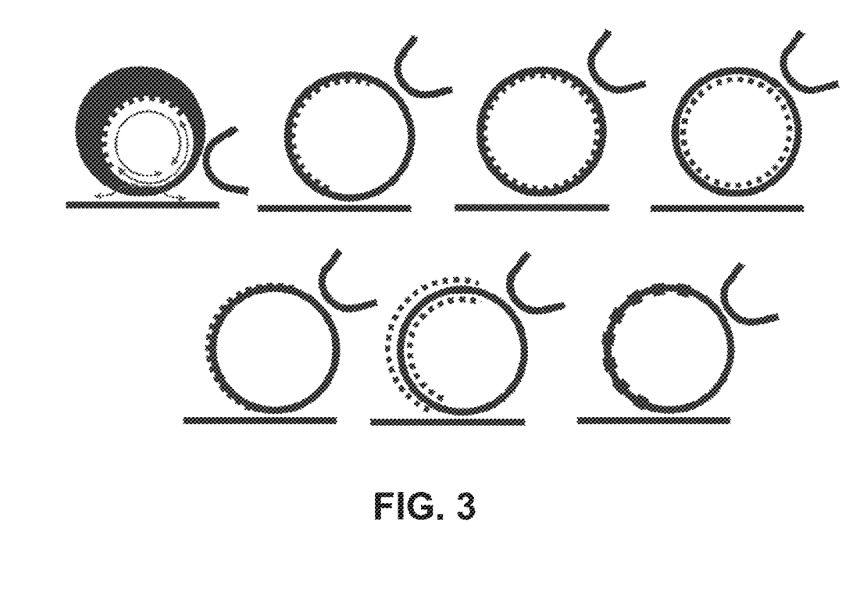
FIG. 3 illustrates a number of different grating designs for the DBR ring resonator in accordance with the disclosed embodiments.

FIG. 3 illustrates a number of different grating designs for the DBR ring resonator in accordance with the disclosed embodiments. More specifically, FIG. 3 illustrates variations of the grating design, each of which uses a square wave perturbation of the waveguide, but can be apodized or reduced in grating strength by either reducing the width modulation or changing the gap between the waveguide and a perturbation element in the edge of the waveguide. These grating designs may also be implemented with a non-square wave perturbation. Note that the top left design in FIG. 3 has an adiabatically varying ring width, which should improve the repeatability of the wavelength of the DBR ring resonator.

Figure 4A:
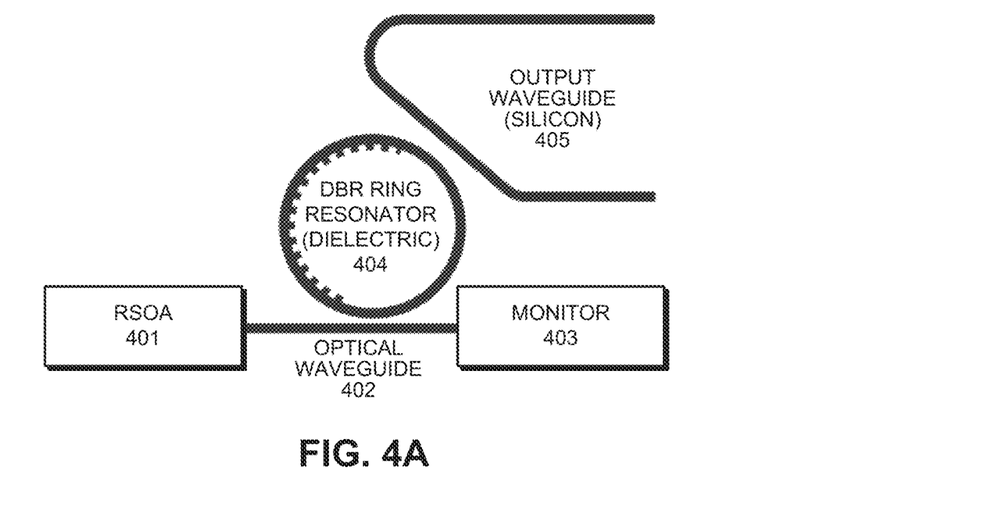
FIG. 4A illustrates an integrated laser, wherein the DBR ring resonator is comprised of a dielectric material and the output waveguide is comprised of silicon, in accordance with the disclosed embodiments.
Figure 4B:
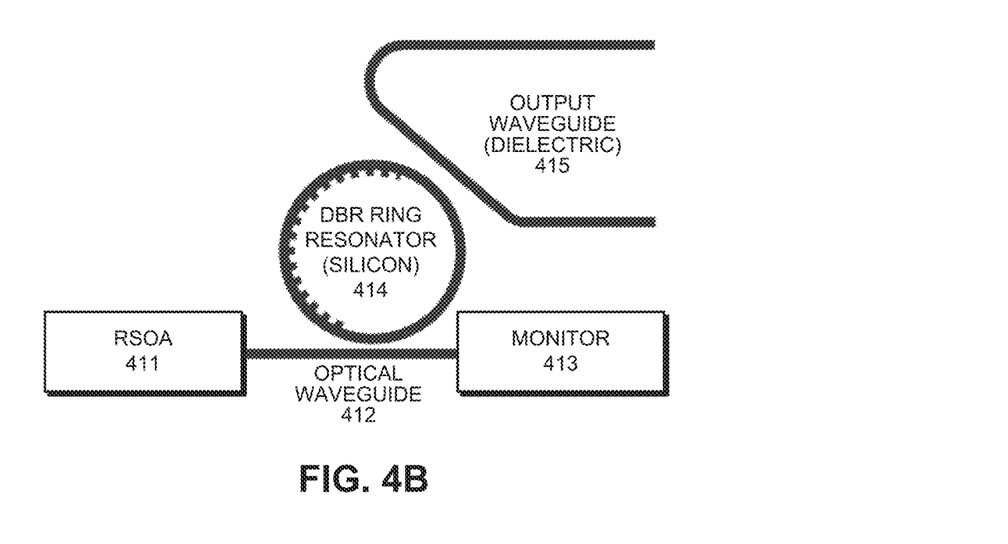
FIG. 4B illustrates an integrated laser, wherein the DBR ring resonator is comprised of silicon and the output waveguide is comprised of a dielectric material, in accordance with the disclosed embodiments.

Referring to FIG. 4A, note that the DBR ring resonator 404 and output waveguide 405 need not both be located on the same vertical layer or comprised of the same material. For example, as illustrated in FIG. 4A, the DBR ring resonator 404 can be comprised of a dielectric material, such as SiON or $TiO_2$, while the output waveguide 405 can be comprised of silicon so the that the resonance is less susceptible to temperature variation. Alternatively, as illustrated in FIG. 4B, ouput waveguide 415 can be comprised of a dielectric material to reduce the footprint of an associated spot size converter, while DBR ring resonater 414 can be comprised of silicon.

Operation of the Integrated Laser

Figure 5:
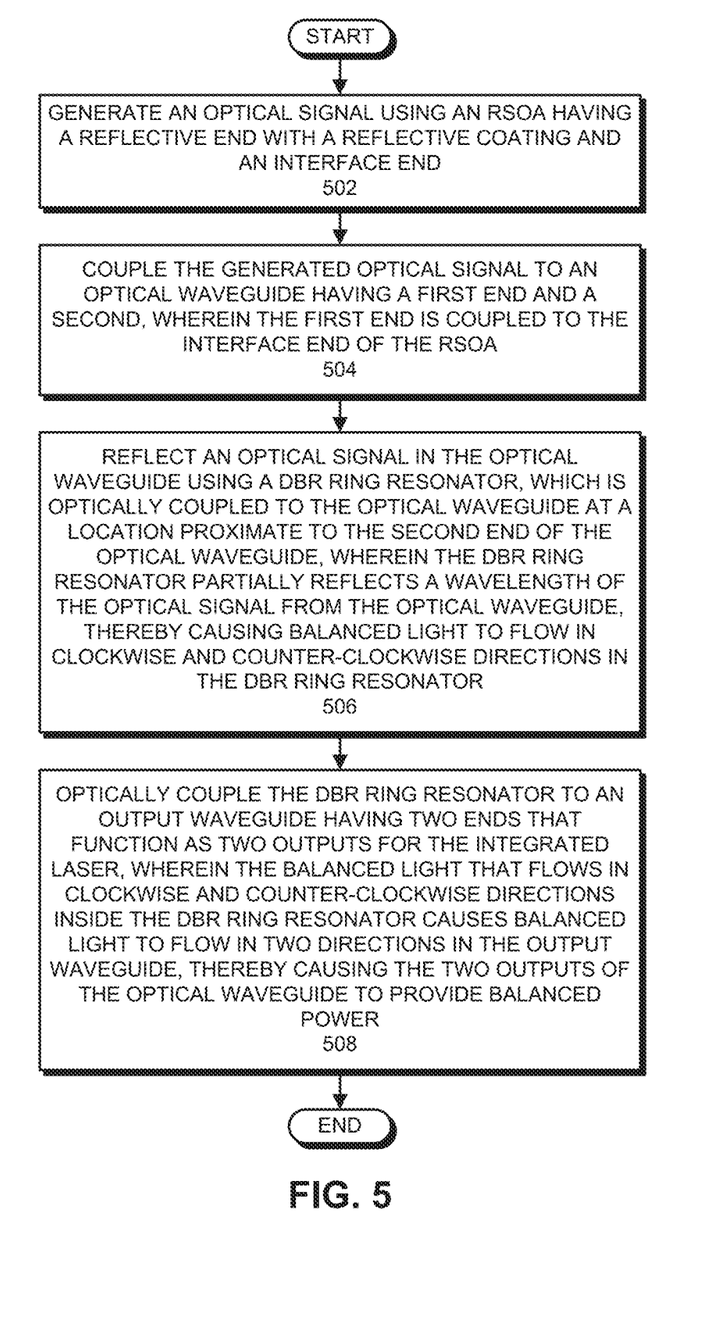
FIG. 5 presents a flow chart illustrating how an integrated laser operates in accordance with an embodiment of the present disclosure.

FIG. 5 presents a flow chart illustrating how a system that includes the integrated laser operates in accordance with an embodiment of the present disclosure. First, the system generates an optical signal using an RSOA having a reflective end with a reflective coating and an interface end (step 502). Next, the system couples the generated optical signal to an optical waveguide having a first end and a second end, wherein the first end is coupled to the interface end of the RSOA (step 504). The system then reflects an optical signal in the optical waveguide using a DBR ring resonator, which is optically coupled to the optical waveguide at a location proximate to the second end of the optical waveguide, wherein the DBR ring resonator partially reflects a wavelength of the optical signal from the optical waveguide, thereby causing balanced light to flow in clockwise and counter-clockwise directions in the DBR ring resonator (step 506). (Note that the RSOA, the optical waveguide and the DBR ring resonator collectively form a lasing cavity for the integrated laser.) Finally, the system optically couples the DBR ring resonator to an output waveguide having two ends that function as two outputs for the integrated laser, wherein the balanced light that flows in clockwise and counter-clockwise directions inside the DBR ring resonator causes balanced light to flow in two directions in the output waveguide, thereby causing the two outputs of the optical waveguide to provide balanced power (step 508).

System

Figure 6:
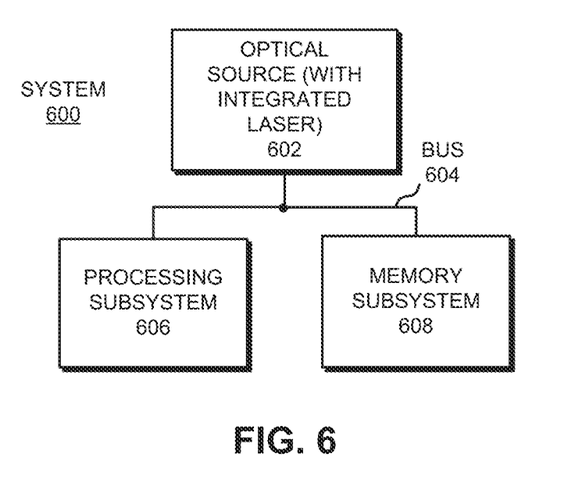
FIG. 6 illustrates a system that includes an optical source, such as an integrated laser, in accordance with an embodiment of the present disclosure.

One or more of the preceding embodiments of the integrated laser may be included in a system or device. More specifically, FIG. 6 illustrates a system 600 that includes an optical source 602 implemented using an integrated laser. System 600 also includes a processing subsystem 606 (with one or more processors) and a memory subsystem 608 (with memory).

In general, components within optical source 602 and system 600 may be implemented using a combination of hardware and/or software. Thus, system 600 may include one or more program modules or sets of instructions stored in a memory subsystem 608 (such as DRAM or another type of volatile or non-volatile computer-readable memory), which, during operation, may be executed by processing subsystem 606. Furthermore, instructions in the various modules in memory subsystem 608 may be implemented in: a high-level procedural language, an object-oriented programming language, and/or in an assembly or machine language. Note that the programming language may be compiled or interpreted, e.g., configurable or configured, to be executed by the processing subsystem.

Components in system 600 may be coupled by signal lines, links or buses, for example bus 604. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication between two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 600 may be at one location or may be distributed over multiple, geographically dispersed locations.

System 600 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, optical source 602 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. An integrated laser, comprising:
   a reflective silicon optical amplifier (RSOA) having a reflective end with a reflective coating and an interface end;
   an optical waveguide with a first end and a second end, wherein the first end is optically coupled to the interface end of the RSOA;
   a distributed-Bragg-reflector (DBR) ring resonator optically coupled to the optical waveguide at a location proximate to the second end of the optical waveguide, wherein the DBR ring resonator partially reflects a wavelength of the optical signal from the optical waveguide, wherein the partial reflections cause balanced light to flow in clockwise and counter-clockwise directions inside the DBR ring resonator;
   wherein the RSOA, the optical waveguide and the DBR ring resonator collectively form a lasing cavity for the integrated laser; and
   an output waveguide having two ends that function as two outputs for the integrated laser, wherein the output waveguide is optically coupled to the DBR ring resonator, which causes balanced light to flow in two directions in the output waveguide, thereby causing the two outputs of the output waveguide to provide balanced power.

2. The integrated laser of claim 1, further comprising one or more additional output waveguides optically coupled to the DBR ring resonator, wherein each additional output waveguide has two ends that function as outputs for the integrated laser, wherein output power is balanced between all of the outputs of the integrated laser.

3. The integrated laser of claim 1, further comprising a monitoring port located at the second end of the optical waveguide.

4. The integrated laser of claim 1, wherein the DBR ring resonator provides a narrow reflection peak resulting from overlapping of ring-resonance peaks and a DBR reflection peak inside the DBR ring resonator.

5. The integrated laser of claim 1, wherein the DBR ring resonator is comprised of a dielectric, non-silicon semiconductor, or polymer material and the output waveguide is comprised of Silicon.

6. The integrated laser of claim 1, wherein the DBR ring resonator includes DBR grating-waveguide perturbations that fill one of: 50% of the circumference of the DBR ring resonator, and 100% of the circumference of the DBR ring resonator.

7. The optical source of claim 1, further comprising an associated modulator coupled to each output of the integrated laser, wherein each output provides an optical carrier signal that is modulated by the associated modulator to communicate information.

8. The integrated laser of claim 1, wherein the DBR ring resonator has an adiabatically varying ring width to facilitate repeatability of a wavelength of the DBR ring resonator.

9. The integrated laser of claim 1, wherein the optical waveguide and the DBR ring resonator are located on a separate semiconductor chip from the RSOA.

10. The integrated laser of claim 9, wherein the separate semiconductor chip includes:
   a substrate;
   a buried-oxide layer disposed on the substrate; and
   a semiconductor layer disposed on the buried-oxide layer, wherein the optical waveguide and the DBR ring resonator are defined in the semiconductor layer.

11. A system, comprising:
   at least one processor;
   at least one memory coupled to the at least one processor; and
   an integrated laser for communicating optical signals generated by the system, wherein the integrated laser includes:
      a reflective silicon optical amplifier (RSOA) having a reflective end with a reflective coating and an interface end;
      an optical waveguide with a first end and a second end, wherein the first end is optically coupled to the interface end of the RSOA;
      a distributed-Bragg-reflector (DBR) ring resonator optically coupled to the optical waveguide at a location proximate to the second end of the optical waveguide, wherein the DBR ring resonator partially reflects a wavelength of the optical signal from the optical waveguide, wherein the partial reflections cause balanced light to flow in clockwise and counter-clockwise directions inside the DBR ring resonator;
      wherein the RSOA, the optical waveguide and the DBR ring resonator collectively form a lasing cavity for the integrated laser; and
      an output waveguide having two ends that function as two outputs for the integrated laser, wherein the output waveguide is optically coupled to the DBR ring resonator, which causes balanced light to flow in two directions in the output waveguide, thereby causing the two outputs of the output waveguide to provide balanced power.

12. The system of claim 11, further comprising one or more additional output waveguides optically coupled to the DBR ring resonator, wherein each additional output waveguide has two ends that function as outputs for the integrated laser, wherein output power is balanced between all of the outputs of the integrated laser.

13. The system of claim 11, further comprising a monitoring port located at the second end of the optical waveguide.

14. The system of claim 11, wherein the DBR ring resonator provides a narrow reflection peak resulting from overlapping of ring-resonance peaks and a DBR reflection peak inside the DBR ring resonator.

15. The system of claim 11, wherein the DBR ring resonator is comprised of a dielectric, non-silicon semiconductor, or polymer material and the output waveguide is comprised of Silicon.

16. The system of claim 11, wherein the DBR ring resonator includes DBR grating-waveguide perturbations that fill one of: 50% of the circumference of the DBR ring resonator, and 100% of the circumference of the DBR ring resonator.

17. The system of claim 11, further comprising an associated modulator coupled to each output of the integrated laser, wherein each output provides an optical carrier signal that is modulated by the associated modulator to communicate information.

18. A method for generating optical signals, comprising:
   generating an optical signal using a reflective silicon optical amplifier (RSOA) having a reflective end with a reflective coating and an interface end;
   coupling the generated optical signal to an optical waveguide having a first end and a second end, wherein the first end is coupled to the interface end of the RSOA;
   reflecting an optical signal in the optical waveguide using a distributed-Bragg-reflector (DBR) ring resonator, which is optically coupled to the optical waveguide at a location proximate to the second end of the optical waveguide, wherein the DBR ring resonator partially reflects a wavelength of the optical signal from the optical waveguide, thereby causing balanced light to flow in clockwise and counter-clockwise directions in the DBR ring resonator;
   wherein the RSOA, the optical waveguide and the DBR ring resonator collectively operate as a lasing cavity; and
   optically coupling the DBR ring resonator to an output waveguide having two ends that function as two outputs for the integrated laser, wherein the balanced light that flows in clockwise and counter-clockwise directions inside the DBR ring resonator causes balanced light to flow in two directions in the output waveguide, thereby causing the two outputs of the output waveguide to provide balanced power.

19. The method of claim 18, further comprising optically coupling the DBR ring resonator to one or more additional output waveguides optically coupled to the DBR ring resonator, wherein each additional output waveguide has two ends that function as outputs for the integrated laser, wherein output power is balanced between all of the outputs of the integrated laser.

20. The method of claim 18, further comprising using a monitoring port located at the second end of the optical waveguide to align a reflection peak of the DBR ring resonator with the laser cavity modes for the integrated laser.

* * * * *

UNITED STATES PATENT AND TRADEMARK OFFICE
CERTIFICATE OF CORRECTION

PATENT NO. : 10,090,645 B2
APPLICATION NO. : 15/190994
DATED : October 2, 2018
INVENTOR(S) : Bovington et al.

It is certified that error appears in the above-identified patent and that said Letters Patent is hereby corrected as shown below:

In the Specification

In Column 4, Line 46, delete "$n_{eff}$" and insert -- $n_{eff}$ --, therefor.

In Column 6, Line 34, delete "ouput" and insert -- output --, therefor.

In Column 6, Line 36, delete "resonater" and insert -- resonator --, therefor.

Signed and Sealed this
Thirty-first Day of December, 2019

Andrei Iancu
*Director of the United States Patent and Trademark Office*